United States Patent [19]

Demmer et al.

[11] Patent Number: 4,746,399

[45] Date of Patent: May 24, 1988

[54] METHOD FOR MAKING METALLIC PATTERNS

[75] Inventors: Christopher G. Demmer, Saffron Walden; Edward Irving, Burwell, both of England

[73] Assignee: Ciba-Geigy Corporation, Ardsley, N.Y.

[21] Appl. No.: 59,646

[22] Filed: Jun. 8, 1987

[30] Foreign Application Priority Data

Jun. 18, 1986 [GB] United Kingdom ............... 8614868

[51] Int. Cl.$^4$ ............................ C23F 1/02; B44C 1/22; C03C 15/00; C03C 25/06
[52] U.S. Cl. .................................. 156/656; 156/150; 156/655; 156/659.1; 156/666; 156/668; 156/902; 156/904; 29/846; 204/15; 427/96
[58] Field of Search ............... 156/150, 151, 655, 656, 156/659.1, 666, 902, 904, 668; 427/96, 97; 29/846, 847, 852, 853; 174/68.5; 361/397, 398; 204/15, 18.1, 23, 24, 38.7

[56] References Cited

PUBLICATIONS

Derwent (Abstract 02694T (Russian) 293,312) Serchugova AV Osharin VI Filipeva NI et al., 03/31/69.

*Primary Examiner*—William A. Powell
*Attorney, Agent, or Firm*—Luther A. R. Hall

[57] ABSTRACT

The present invention provides a method for making a metallic pattern on a substrate having a surface comprising bare metal in predetermined areas and metal coated by a resist in remaining areas which comprises (i) protecting the bare metal by electrodepositing a resin thereon, (ii) while leaving the electrodeposited resin substantially uncured, removing the resist from said remaining areas using a solvent which will not remove the electrodeposited resin, thereby exposing metal in said remaining areas, (iii) etching the metal exposed in (ii) using an etchant which does not remove the electrodeposited resin, and (iv) removing the electrodeposited resin with a suitable solvent.

12 Claims, No Drawings

METHOD FOR MAKING METALLIC PATTERNS

The present invention relates to a method for making metallic patterns such as printed circuits and the like.

There are numerous methods used for the manufacture of printed circuit boards, although some of the steps used are common to the various methods.

In the case of single sided printed circuit boards, the board, comprising a copper clad base laminate, has holes drilled where desired, a resist is coated on the copper in a predetermined pattern, using screen printing or photoimaging techniques, to give a board having bare copper in some areas and copper coated by the resist in remaining areas, the bare copper is then plated with a tin-lead alloy, the resist is then removed, the copper thereby exposed is etched using an etchant which does not remove the tin-lead alloy, which is finally removed using a tin-lead alloy stripper.

In the case of double sided, plated through hole printed circuit boards, the procedure is similar, but with the following additional steps: after the holes are drilled the board is subjected to electroless copper deposition to deposit copper on the surface of the holes (as well as over all the copper); and after applying the resist in a predetermined pattern the board is subjected to copper electroplating to deposit copper on the bare copper parts including the surface of the holes.

Disadvantages of these processes are the high cost of the tin-lead alloy stripper and the necessary subsequent cleaning; and the tin-lead stripper (usually a mixture of hydrogen peroxide and sulphuric acid) is aggressive to the boards themselves and to personnel and equipment used in carrying out the stripping.

We have now found that the copper left bare after applying the resist can be protected by electrodeposition of an electrodepositable resin that is strippable by a different solvent from that used to strip the resist, and which is not removed by the copper etchant.

Electrodepositable resins have been known for many years and are commonly used for coating metal articles, e.g. painting car bodies and accessories, steel girders, and household items such as washing machines. In all these uses the resin is electrodeposited and then cured. There has been a proposal in Russian Patent Specification No. 293312 to use an electrodepositable resin to protect exposed copper during the manufacture of a printed circuit board, but again, after electrodeposition the resin is thermally cured. This makes removal difficult and conditions are needed, an alkaline solution at 70° to 80° C., which can damage the base laminate of a circuit board.

We have found that sufficient protection can be given without substantially curing the electrodeposited resin.

Accordingly the present invention provides a method for making a metallic pattern on a substrate having a surface comprising bare metal in predetermined areas and metal coated by a resist in remaining areas which comprises (i) protecting the bare metal by electrodepositing a resin thereon, (ii) while leaving the electrodeposited resin substantially uncured, removing the resist from said remaining areas using a solvent which will not remove the electrodeposited resin, thereby exposing metal in said remaining areas, (iii) etching the metal exposed in (ii) using an etchant which does not remove the electrodeposited resin, and (iv) removing the electrodeposited resin with a suitable solvent.

The resist may be an epoxide resin applied by a screen printing process and then cured. Preferably, the resist is a photoresist coated in selected areas by applying it uniformly to the substrate, which is usually a copper-clad laminate, subjecting it to actinic radiation, in a predetermined pattern and then removing exposed or unexposed areas according to whether the photoresist is positive or negative respectively. Positive and negative photoresists for use in making printed circuit boards are well known materials and any of them may be used. They can be strippable under aqueous conditions or by means of an organic solvent. A layer of another metal such as nickel may be deposited on bare copper areas before electrodeposition of the resin.

The electrodepositable resin may be anodically depositable or cathodically depositable, which are base-strippable and acid-strippable respectively. Anodically depositable resins are preferred if acidic etchants are to be used, and cathodic types are preferred if alkaline etchants for copper are to be used.

A particularly preferred combination is the use of a photoresist which is strippable under aqueous conditions and an electrodepositable resin which is strippable by means of an organic solvent.

Any of the large number of electrodepositable resins may be used including acrylic resins; adducts of epoxide resins with amines or polycarboxylic, amino or mercapto acids; polyurethanes; polyester; and reaction products of phenolic hydroxyl group-containing resins with an aldehyde and amine or amino- or mercapto-carboxylic acids. Suitable acrylic resins include copolymers of at least one acrylic ester such as an alkyl or hydroxyalkyl acrylate or methacrylate with an ethylenically unsaturated monomer containing a salt-forming group, such as an acrylic monomer containing a carboxyl or tertiary amino group and, optionally, another ethylenically unsaturated monomer. Suitable epoxide resin adducts include those of diglycidyl ethers of dihydric alcohols or bisphenols with a stoichiometric excess of a primary or secondary monoamine or polyamine such as ethanolamine, diethanolamine or ethylenediamine, a polycarboxylic acid such as glutaric or adipic acid, a polycarboxylic acid anhydride such as maleic or succinic anhydride, an aminocarboxylic acid such as o-, m- or p-aminobenzoic acid or a mercaptocarboxylic acid. Suitable polyurethanes include adducts of hydroxyl-terminated polyurethanes with polycarboxylic acid anhydrides. Suitable polyesters include carboxyl-terminated polyesters derived from polyhydric alcohols such as ethylene glycol, 1,2-propylene glycol, ,3-propylene glycol or butane-1,4-diol with polycarboxylic acids such as glutaric, adipic, maleic, tetrahydrophthalic and phthalic acids or esterifying derivatives thereof. Suitable reaction products of phenolic hydroxyl-containing resins include reaction products of phenol-terminated adducts of diglycidyl ethers with bisphenols, aldehydes such as formaldehyde or benzaldehyde and amines such as ethanolamine, diethanolamine or ethylene diamine, aminocarboxylic acids such as glycine, sarosine or aspartic acid, or mercaptocarboxylic acids such as thioglycolic or 3-mercaptopropionic acid.

Preferred electrodepositable resins are copolymers of at least one monoacrylic ester, particularly selected from ethyl acrylate, ethyl acrylate, 2-hydroxyethyl acrylate, 2-hydroxypropyl acrylate, butyl acrylate, ethylhexyl acrylate and the corresponding methacrylates, with at least one monoacrylic monomer containing a carboxyl or tertiary amino group, particularly acrylic acid, methacrylic acid or dimethylaminoethyl methacrylate and, optionally, with a further vinyl monomer such as styrene. Other preferred electrodepositable resins are adducts of a diglycidyl ether of a bisphenol, particularly, bisphenol A, which may have been advanced, with a monoamine, particularly diethanolamine.

The amount of resin deposited needs to be sufficient to cover the exposed metal completely and protect it during removal of the photoresist and during etching of the metal thereby exposed.

Electrodeposition for only a few minutes, usually one minute, at a voltage of up to 200 volts is sufficient in most cases. Voltages as low as 2 volts may be used in some cases, especially if the size of the electrode on which the resin is deposited is small in relation to the other electrode. For example a cathodically depositable resin may be deposited on a small cathode in a tank where the whole of the tank is the anode, at voltages of 2 volts or 5 volts.

We have found the adhesion of the coating is improved if it is deposited in two steps, first at a low voltage and then at a slightly higher voltage. For example a good coating can be obtained by electrodepositing the resin at 2 volts for 2 minutes, followed by deposition at 5 volts for up to 5 minutes.

It is also possible to use a combination of a photoresist and an electrodepositable resin which are both basic or both acidic strippable provided that the photoresist is strippable under milder conditions than are needed to remove the electrodeposited resin, e.g. a more dilute solution of base or acid.

The electrodeposited resin is preferably dried without curing it, for example by heating at a temperature up to 100° C., before carrying out the etching step (iii), more preferably before removing the resin in step (ii).

When an organic solvent is used to remove the resist, a suitable solvent which does not dissolve the electrodeposited resin can be found by routine experimentation. Both this solvent and the solvent used to remove the electrodeposited resin can be selected from halohydrocarbons such as 1,1,1-trichloroethane and dichloromethane, hydroxylic solvents such as 2-n-butoxyethanol and 2-ethoxyethanol, esters such as 2-ethoxyethyl acetate, ketones such as acetone and methyl ethyl ketone and ethers such as tetrahydrofuran. Where, for example, the electrodeposited resin is derived from an epoxy resin and the resist is an acrylic material, the resist can be removed using a halohydrocarbon solvent and the electrodeposited resin can be removed using a ketone.

The metal exposed by removal of the resist, usually copper, may be removed by any well known etchant such as ferric chloride, hydrogen peroxide/phosphoric acid, ammonium persulphate or cupric chloride.

The present invention is also very useful for use with multilayer circuit boards, especially when via holes and through contacts are present.

The invention is illustrated by the following Examples in which parts are parts by weight. The resins used in the Examples are:

RESIN 1

Methyl methacrylate (55 pts), methacrylic acid (5 pts), 2-hydroxyethyl methacrylate (40 pts) and tert.dodecylmercaptan (0.03 pts) are heated to reflux in tetrahyrofuran (THF) (350 pts). Azobis(isobutyronitrile) (1.5 pts) is added and the mixture maintained at reflux for 5 hours under nitrogen. The reaction mixture is cooled to ambient temperature and added slowly to stirred hexane (900 pts). A precipitate is formed which is filtered off and washed with further hexane. The product is dried at 40° C. in a vacuum oven to yield 87 pts of a copolymer-acid value 0.56 eq/kg, molecular weight (number average) 7206.

RESIN 2

Styrene (50 pts), dimethylaminoethyl methacrylate (10 pts), ethylhexyl methacrylate (20 pts), 2-hydroxypropyl methacrylate (20 pts) and tert.dodecylmercaptan (0.03 pts) are dissolved in THF (340 pts). Azobis(isobutyronitrile) (1.5 pts) in THF (10 pts) is added and the mixture held at reflux for 5 hours under nitrogen. The reaction mixture is stripped under vacuum to obtain a resinous solid which is further dried in a vacuum oven at 40° C. The solid copolymer obtained has an amine value 0.22 eq/kg and molecular weight (number average) 14,538.

RESIN 3

A monomer mixture consisting of styrene (26.25 pts), ethylhexyl acrylate (10 pts), 2-hydroxyethyl methacrylate (10 pts) and dimethylaminoethyl methacrylate (3.75 pts) with azobis(isobutyronitrile) (0.75 pts) is added dropwise over 2 hours to butoxyethanol (25 pts) stirred under nitrogen at 100° C. The reaction mixture is maintained at 100° C. for a further hour and a further charge of azobis(isobutyronitrile) (0.25 pts) and butoxyethanol (5.0 pts) added. This procedure is repeated twice more. The reaction mixture is diluted with butoxyethanol (10 pts) to reduce solids to around 50% and stripped on a rotary evaporator under vacuum to remove any monomers still present. The amine value of the resulting solution is 0.23 eq/kg and the molecular weight (number average) of the copolymer is 9410.

RESIN 4

A monomer mixture consisting of methyl methacrylate (46 pts), butyl acrylate (50 pts), methacrylic acid (4 pts) with azobis(isobutyronitrile) (1.5 pts) is added dropwise over 2 hours to butoxyethanol (25 pts) stirred under nitrogen at 100° C. The reaction mixture is maintained at 100° C. for a further 1 hour and a further charge of azobis(isobutyronitrile) (1.5 pts) in butoxyethanol (10 pts) added. This procedure is repeated twice more. The reaction mixture is diluted with butoxyethanol (20 pts) to reduce solids content to around 50% and stripped on a rotary evaporator under vacuum to remove any monomers still present. The acid value of the resulting solution is 0.23 eq/kg and the molecular weight of the copolymer is 13,276.

RESIN 5

An epoxide resin prepared by advancing a diglycidyl ether of bisphenol A by reaction with bisphenol A (epoxy value 0.99 mol/kg, 100 g) is heated to 140° C. together with butoxyethanol (60 g) to form a solution. To this is added a solution of diethanolamine (10.7 g) in butoxyethanol (13.8 g) and the temperature of the mixture maintained at 140° C. for a further 4 hours, after which time it is cooled. The resulting solution has an amine value of 0.55 mol/kg and an epoxy value of zero.

RESIN 6

A monomer mixture consisting of styrene (47.5 pts), ethylhexylacrylate (25 pts), 2-hydroxyethylmethacrylate (10 pts) and dimethylaminoethylmethacrylate (7.5 pts) with azobis(isobutyronitrile) (1.5 pts) is added dropwise over 2 hours to butoxyethanol (57.5 pts) stirred under nitrogen at 100° C. The reaction mixture is maintained at 100° C. for a further 1 hour and a further charge of azobis(isobutyronitrile) (0.5 pts) and butoxyethanol added. This procedure is repeated twice more and the reaction mixture held a 100° C. for a further 1 hour at 100° C. and then cooled. The amine value of the resulting solution is 0.28 eq/kg and the molecular weight of the copolymer is 10.416.

RESIN 7

A monomer mixture consisting of styrene (40 pts), ethylhexylacrylate (32.5 pts), 2-hydroxyethylmethacrylate (20 pts) and dimethylaminoethylmethacrylate (7.5 ts) with azobis(isobutyronitrile) (1.5 pts) is added dropwise over 2 hours to butoxyethanol (57.5 pts) stirred under nitrogen at 100° C. The reaction mixture is maintained at 100° C. for a further 1 hour and a further charge of azobis(isobutyronitrile) (0.5 pts) and butoxyethanol added. This procedure is repeated twice more and the reaction mixture held a 100° C. for a further 1 hour at 100° C. and then cooled. The amine value of the reacting solution is 0.28 eq/kg and the molecular weight of the copolymer is 10.307.

RESIN 8

A monomer mixture consisting of styrene (55 pts), ethylhexylacrylate (20 pts), 2-hydroxyethylmethacrylate (20 pts) and dimethylaminoethylmethacrylate (5 pts) with azobis(isobutyronitrile) (1.5 pts) is added dropwise over 2 hours to butoxyethanol (50 pts) stirred under nitrogen at 100° C. The reaction mixture is maintained at 100° C. for a further 1 hour and a further charge of azobis(isobutyronitrile) (0.5 pts) in butoxyethanol (10 pts) added. This procedure is repeated twice more. The reaction mixture is diluted with butoxyethanol (20 pts) to reduce the solids content to around 50% and stripped on a rotary evaporator under vacuum to remove any monomers still present. The amine value of the resulting solution is 0.5 eq/kg.

RESIN 9

A monomer mixture consisting of styrene (35 pts), butylacrylate (35 pts), 2-hydroxyethylmethacrylate (15 pts) and dimethylaminoethylmethacrylate (15 pts) with azobis(isobutyronitrile) (1.5 pts) is added dropwise over 2 hours to butoxyethanol (50 pts) stirred under nitrogen at 100° C. The reaction mixture is maintained at 100° C. for a further 1 hour and a further charge of azobis(isobutyronitrile) (0.5 pts) in butoxyethanol (10 pts) added. This procedure is repeated twice more. The reaction mixture is diluted with butoxyethanol (20 pts) to reduce the solids content to around 50% and stripped on a rotary evaporator under vacuum to remove any monomers still present. The amine value of the resulting solution is 0.45 eq/kg.

RESIN 10

A monomer mixture consisting of methylmethacrylate (66 pts), butylacrylate (26.2 pts), and dimethylaminoethylmethacrylate (7.8 pts) with azobis(isobutyronitrile) (1.0 pts) is added dropwise over 3 and a half hours to butoxy-ethanol (60 pts) at 105° C. The reaction mixture is maintained at 100° C. for a further 1 hour and a further charge of azobis(isobutyronitrile) (0.1 pts) in butoxyethanol (4 pts) added. After a further 1 hour at 105° C. the mixture is stripped on a rotary evaporator under vacuum to remove any monomers still present. The amine value of the resulting solution is 0.30 eq/kg.

RESIN 11

A monomer mixture consisting of styrene (15 pts), methylmethacrylate (27.5 pts), ethylhexyl acrylate (30 pts), 2-hydroxyethyl methacrylate (20 pts) and dimethylaminoethylmethacrylate (7.5 pts) with azobis(isobutyronitrile) (1.5 pts) is added dropwise over 2 hours to butoxyethanol (50 pts) at 100° C. The reaction mixture is maintained at 100° C. for a further 1 hour and a further charge of azobis(isobutyronitrile) (0.5 pts) in butoxyethanol (5.5 pts) added. After a further 1 hour at 100° C. the mixture is cooled. The amine value of the resulting solution is 0.28 eq/kg and the molecular weight of the copolymer is 10.348.

EXAMPLE 1

An aqueous developable negative working photoresist composition is prepared from:

triethylene glycol dimethacrylate: 20 pts
benzophenone: 4 pts
Michler's Ketone: 1 pts
Styrene/butyl maleate copolymer (available from Monsanto as Scripset 540): 75 pts
methyl ethyl ketone: 200 pts This is coated on a copper clad laminate using a wire-wound rod and dried at 90° C. for 5 minutes to produce a film 8 micrometers thick. The film is irradiated through an image bearing transparency for 30 seconds using a 5000 w medium pressure mercury halide lamp at a distance of 75 cm. On immersing in a 0.5% aqueous solution of sodium hydroxide at 25° C. photoresist is removed from unirradiated areas so that copper is exposed in those areas and a clear negative image of the transparency is formed.

The image bearing copper clad laminate is then immersed as the anode in an electrodeposition bath equipped with a stainless steel cathode and containing the following solution:

Resin 1: 50 pts
butoxyethanol: 50 pts
potassium hydroxide (20% aqueous): 7.9 pts
water: 392.1 pts A voltage of 50 volts is applied for 60 seconds, the copper clad laminate removed from the bath rinsed with water and dried at 90° C. for 5 minutes. The electrodeposited resin fills the areas where copper is exposed. The laminate is then immersed in a stirred bath of 1.5% aqueous solution of sodium hydroxide at 25° C. This treatment removes the photoresist, leaving the electrodeposited resin.

The exposed copper is etched away by immersion in a 40% aqueous solution of ferric chloride at 30° C., after which the plate is washed in water and dried. Immersion for 5 minutes in 5% aqueous sodium hydroxide completely removes residual resin, leaving a clear pattern, in copper, on the laminate base.

EXAMPLE 2

A copper clad laminate coated with a RISTON negative aqueous developable photoresist which has been imaged and developed to form a pattern in the RISTON photoresist is used as the cathode in an electrodeposition bath equipped with a stainless steel anode. The electrodeposition bath contains the following solution:

Resin 2: 40 pts butoxyethanol: 30 pts
lactic acid (15% aqueous): 13 pts
water: 317 pts A voltage of 40 volts is applied for 60 seconds, the copper clad laminate removed from the bath, rinsed with water and dried at 90° C. for 5 minutes. The electrodeposited resin fills the areas where the copper is exposed. The laminate is then immersed in a stirred bath of 3% aqueous solution of potassium hydroxide at 40° C. This treatment removes the photoresist leaving the electrodeposited resin.

The exposed copper is etched away by immersion in a 40% aqueous solution of ferric chloride at 30° C., after which the plate is washed in water and dried. Immersion in a bath of acetone completely removes residual resin, leaving a clear pattern, in copper, on the laminate base.

EXAMPLE 3

A copper clad laminate coated with a Riston aqueous developable negative photoresist which has been imaged and developed to form a pattern in the Riston photoresist is used as the cathode in an electrodeposition bath equipped with a stainless steel anode. The elecrodeposition bath contains the following solution:

Resin 3: 100 pts
lactic acid (20% aqueous): 6.6 pts
water: 393.4 pts

A voltage of 50 volts is applied for 60 seconds, the copper clad laminate removed from the bath rinsed with water and dried at 90° C. for 5 minutes. The electrodeposited resin fills the areas where copper is exposed. The laminate is then immersed in a stirred bath of 3% aqueous solution of potassium hydroxide at 40° C. This treatment removes the photoresist leaving the electrodeposited resin.

The exposed copper is etched away by immersion in an etch bath at 40° C. containing ammonium persulphate (125 g), phosphoric acid (75%-25 cm$^3$) made up to 500 cm$^3$ with water. After rinsing in water and drying, immersion in a bath of acetone completely removes residual resin, leaving a clear pattern, in copper, on the laminate base.

EXAMPLE 4

Following the procedure of Example 3 a RISTON-coated laminate is used to obtain an image of the original photoresist in electrodeposited Resin 3. The exposed copper is etched away by immersion in a bath at 70° C. containing hydrogen peroxide (30% -200 g), phosphoric acid (75%-200 g) and potassium permanganate (0.006 g) made up to 1 liter with water. After rinsing in water and drying, immersion in a bath of acetone completely removes residual resin, leaving a clear pattern, in copper, on the laminate base.

EXAMPLE 5

Following the procedure of Example 3 a RISTON-coated laminate is used to obtain an image in electrodeposited Resin 3 of the original photoresist. The exposed copper is etched away by immersion in a bath at 25° C. containing ammonium chloride (21.4 g), ammonia (25%-12 g), hydrogen peroxide (30%-12 cm$^3$) and water (150 g). After rinsing in water and drying, immersion in a bath of acetone completely removes residual resin, leaving a clear pattern, in copper, on the laminate base.

EXAMPLE 6

A copper clad laminate coated with a RISTON aqueous developable negative photoresist which has been imaged and developed to form a pattern in the RISTON photoresist is used as the anode in an electrodeposition bath equipped with a stainless steel anode. The electrodeposition bath contains the following solution:

Resin 4: 100 pts
potassium hydroxide (20% aqueous): 5.2 pts
water: 394.8 pts

A voltage of 80 volts is applied for 60 seconds, the copper clad laminate removed from the bath rinsed with water and dried at 90° C. for 5 minutes. The electrodeposited resin fills the areas where copper is exposed. The laminate is then immersed in a stirred bath of 3% aqueous solution of potassium hydroxide at 40° C. This treatment removes the photoresist leaving the electrodeposited resin.

The exposed copper is etched away by immersion in a 40% aqueous solution of ferric chloride at 30° C., after which the plate is washed in water and dried. Immersion in a bath of acetone completely removes residual resin, leaving a clear pattern, in copper, on the laminate base.

EXAMPLE 7

A copper clad laminate coated with a RISTON negative photoresist which has been developed to form a pattern in the RISTON photoresist is used as the cathode in an electrodeposition bath equipped with a stainless steel anode. The electrodeposition bath contains the following solution:

Resin 5: 60 pts
butoxyethanol: 50 pts
lactic acid (20% aqueous): 15.8 pts
water: 474.2 pts A voltage of 30 volts is applied for 60 seconds, the copper laminate removed from the bath, rinsed with water and dried at 90° C. for 5 minutes. The electrodeposited resin fills the areas where the copper is exposed. The laminate is then immersed in a stirred bath containing a solvent mixture consisting of 1,1,1-trichloroethane and dichloromethane (80:20). This treatment removes the photoresist leaving the electrodeposited resin.

The exposed copper is etched away by immersion in a 40% aqueous solution of ferric chloride at 30° C., after which the plate is washed in water and dried. Immersion in a bath of acetone completely removes residual resin, leaving a clear pattern, in copper, on the laminate.

EXAMPLE 8

A positive-working photoresist composition is prepared by mixing the reaction product of 1,2-naphthoquinone-2-diazide-5-sulphonyl chloride and 2,3,4-trihydroxybenzophenone—degree of esterification 2.5 mole with a p-tert.butyl phenol, phenol novolak (mole ratio 0.25:0.75) such that the ratio of novolak to sensitizer is 5:1. The mixture is dissolved in a solvent blend of 2-ethoxyethanol, 2-ethoxyethyl acetate and methyl ethyl ketone (volume ratio 2:2:1) to obtain a solution of 40% solids by weight. The solution is applied by a wire wound rod to a copper clad laminate and the laminate dried at 90° C. for 5 minutes, giving a resin film 30 micrometers thick. It is then irradiated through a image-bearing transparency for 30 seconds, using a 5000 w medium pressure mercury halide lamp at a distance of 75 cm. The laminate is immersed in a bath containing 0.5% aqueous sodium hydroxide for 1 minute after which time a positive image develops.

The image-bearing copper clad laminate is then immersed as the cathode in an elctrodeposition bath equipped with a stainless steel anode and containing the following solution:
Resin 3: 100 pts
lactic acid (20% aqueous): 6.6 pts
water: 393.4 pts A voltage of 50 volts is applied for 60 seconds, the copper clad laminate removed from the bath, rinsed with water and dried at 90° C. for 5 minutes. The electrodeposited resin fills the areas where copper is exposed. The laminate is then immersed in a stirred bath of 3% aqueous solution of potassium hydroxide at 40° C. This treatment removes the photoresist leaving the electrodeposited resin.

The exposed copper is etched away by immersion in an etch bath containing 40% aqueous ferric chloride at 30° C., after which the plate is washed in water and dried. Immersion in a bath of acetone completely removes residual resin, leaving a clear pattern, in copper, on the laminate base.

EXAMPLE 9

A copper clad laminate with a RISTON aqueous developable negative photoresist, which has been imaged and developed to form a pattern in the RISTON photoresist, is used as the cathode in an electrodeposition bath equipped with a stainless steel anode. The electrodeposition bath contains the following solution:
Resin 3: 100 pts
lactic acid (20%): 6.6 pts
water: 393.4 pts A voltage of 50 volts is applied for 50 seconds, the copper clad laminate removed from the bath and rinsed with water. The electrodeposited resin fills the areas where copper is exposed. The laminate is then immersed in a stirred bath of 3% aqueous solution of potassium hydroxide at 40° C. This treatment removes the photoresist leaving the electrodeposited resin. The laminate is dried at 90° C. for 5 minutes. The exposed copper is etched away by immersion in a 40% aqueous solution of ferric chloride at 30° C., after which the plate is washed in water. Immersion in a bath of acetone completely removes residual resin, leaving a clear pattern, in copper, on the laminate base.

EXAMPLE 10

A copper clad laminate with a RISTON aqueous developable negative photoresist, which had been imaged and developed to form a pattern in the RISTON photoresist, is used as the cathode in an electrodeposition bath equipped with a stainless steel anode. The electrodeposition bath contains the following solution:
Resin 3: 100 pts
lactic acid (20%): 6.6 pts
water: 393.4 pts A voltage of 50 volts is applied for 60 seconds, the copper clad laminate removed from the bath and rinsed with water. The electrodeposited resin fills the areas where copper is exposed. The laminate is then immersed in a stirred bath of 3% aqueous solution of potassium hydroxide at 40° C. This treatment removes the photoresist leaving the electrodeposited resin. The exposed copper is etched away by immersion in a 40% aqueous solution of ferric chloride at 30° C., after which the plate is washed in water. Immersion in a bath of acetone completely removes residual resin, leaving a clear pattern, in copper, on the laminate base.

EXAMPLE 11

A copper clad laminate with a RISTON aqueous developable negative photoresist, which has been imaged and developed to form a pattern in the RISTON photoresist, is used as the cathode is an electrodeposition bath equipped with a stainless steel anode. The electrodeposition bath contains the following solution:
Resin 6: 100 pts
lactic acid (20% aqueous): 16.8 pts
water: 483.2 pts A voltage of 50 volts is applied for 60 seconds, the copper clad laminate removed from the bath, rinsed with water and dried at 90° C. for 5 minutes. The electrodeposited resin fills the areas where copper is exposed. The laminate is then immersed in a stirred bath of 3% aqueous solution of potassium hydroxide at 40° C. This treatment removes the photoresist leaving the electrodeposited film. The exposed copper is etched away by immersion in an etch bath containing 40% aqueous ferric chloride at 30° C., after which the plate is washed in water and dried. Immersion in a bath of acetone completely removes residual resin, leaving a clear pattern, in copper, on the laminate base.

EXAMPLE 12

Example 11 is repeated except that the voltage applied is 20 volts for 60 seconds. A clear pattern, in copper, is again obtained on the laminate base.

EXAMPLE 13

Example 11 is repeated except that the voltage applied is 120 volts for 60 seconds. A clear pattern, in copper, is again obtained on the laminate base.

EXAMPLE 14

Example 11 is repeated except that a double sided copper clad laminate with through holes with a RISTON aqueous developable negative photoresist, which has been imaged and developed, on both sides is used. A clear pattern, in copper, on both sides of the laminate base and in the through holes is obtained.

EXAMPLE 15

A copper clad laminate with a RISTON aqueous developable negative photoresist, which has been imaged and developed to form a pattern in the RISTON photoresist, is used as the cathode in an electrodeposition bath equipped with a stainless steel anode. The electrodeposition bath contains the following solution:
Resin 7: 100 pts
lactic acid (20% aqueous): 16.8 pts
water: 483.2 pts A voltage of 50 volts is applied for 60 seconds, the copper clad laminate removed from the bath, rinsed with water and dried at 90° C. for 5 minutes. The electrodeposited resin fills the areas where copper is exposed. The laminate is then immersed in a stirred bath of 3% aqueous solution of potassium hydroxide at 40° C. This treatment removes the photoresist leaving the electrodeposited film. The exposed copper is etched away by immersion in an etch bath containing 40% aqueous ferric chloride at 30° C., after which the plate is washed in water and dried. Immersion in a bath of acetone completely removes residual resin, leaving a clear pattern, in copper, on the laminate base.

EXAMPLE 16

Example 15 is repeated except that the electrodeposition bath contains the following solution:
Resin 8: 100 pts
lactic acid (20% aqueous): 6.6 pts
water: 393.4 pts
And a voltage of 30 volts is applied for 60 seconds. A clear pattern, in copper, on the laminate base is obtained.

EXAMPLE 17

Example 15 is repeated except that the electrodeposition bath contains the following solution:
Resin 9: 100 pts
lactic acid (20% aqueous): 13.8 pts
water: 386.2 pts
and a voltage of 40 volts is applied for 60 seconds. A clear pattern, in copper, on the laminate base is obtained.

EXAMPLE 18

Example 15 is repeated except that the electrodeposition bath contains the following solution:
Resin 10: 100 pts
lactic acid (20% aqueous): 9 pts
water: 391 pts
A clear pattern, in copper, on the laminate base is obtained.

EXAMPLE 19

Example 15 is repeated except that the electrodeposition bath contains the following solution:
Resin 11: 100 pts
lactic acid (20% aqueous): 6.7 pts
water: 493.3 pts
A clear pattern, in copper, on the laminate base is obtained.

EXAMPLE 20

A copper clad laminate with a RISTON aqueous developable negative photoresist, which has been imaged and developed to form a pattern in the RISTON photoresist, is used as the cathode in an electrodeposition bath equipped with a stainless steel anode. The electrodeposition bath contains the following solution:
Resin 6: 100 pts
lactic acid (20% aqueous): 16.8 pts
water: 383.2 pts
A voltage of 2 volts is applied for 2 minutes and then a voltage of 5 volts is applied for 4 minutes. The laminate is removed from the bath, rinsed with water and dried at 90° C. for 5 minutes. The electrodeposited resin fills the areas where copper is exposed. The laminate is then immersed in a stirred bath of 3% aqueous solution of potassium hydroxide at 40° C. This treatment removes the photoresist leaving the electrodeposited film. The exposed copper is etched away by immersion in an etch bath containing 40% aqueous ferric chloride at 30° C., after which the plate is washed in water and dried. Immersion in a bath of acetone completely removes residual resin, leaving a clear pattern, in copper, on the laminate base.

What is claimed is:

1. A method for making metallic pattern on a substrate having a surface comprising bare metal in predetermined areas and metal coated by a resist in remaining areas which comprises (i) protecting the bare metal by electrodepositing a resin thereon, (ii) while leaving the electrodeposited resin substantially uncured, removing the resist from said remaining areas using a solvent which will not remove the electrodeposited resin, thereby exposing metal in said remaining areas, (iii) etching the metal exposed in (ii) using an etchant which does not remove the electrodeposited resin, and (iv) removing the electrodeposited resin with a suitable solvent.

2. A method as claimed in claim 1 in which the resist is a photoresist which is strippable under aqueous conditions or by means of an organic solvent.

3. A method as claimed in claim 2 in which the photoresist is strippable under aqueous conditions and the electrodeposited resin is strippable by means of an organic solvent.

4. A method as claimed in claim 1 in which the electrodepositable resin is an acrylic resin; an adduct of an epoxide resin with an amine, a polycarboxylic acid or anhydride, an aminocarboxylic acid or a mercaptocarboxylic acid; a polyurethane; a polyester; or a reaction product of a phenolic hydroxyl group-containing resin with an aldehyde and an amine or an amino- or mercapto-carboxylic acid.

5. A method as claimed in claim 4, in which the electrodeposited resin is a copolymer of at least one monoacrylic ester with at least one monoacrylic monomer containing a carboxyl or tertiary amino group and, optionally, with a further vinyl monomer.

6. A method as claimed in claim 4, in which the electrodeposited resin is an adduct of a digylcidyl ether of a bisphenol, which may have been advanced, with a monoamine.

7. A method as claimed in claim 1 in which the electrodeposition is carried out at a voltage of from 2 to 200 volts.

8. A method as claimed in claim 7 in which the electrodeposition is carried out in two stages, first at a low voltage and then at a slightly higher voltage.

9. A method as claimed in claim 1 in which the electrodeposited resin is dried without curing it before carrying out the etching step (iii).

10. A method as claimed in claim 9, in which the electrodeposited resin is dried before removing the resist in step (ii).

11. A method according to claim 1 in which the metallic pattern is a printed circuit and the metal is copper.

12. A method according to claim 11 in which the printed circuit is on a board having through holes.

* * * * *